(12) United States Patent
Huang et al.

(10) Patent No.: US 7,195,982 B2
(45) Date of Patent: Mar. 27, 2007

(54) METHOD FOR MANUFACTURING ANTI-PUNCH THROUGH SEMICONDUCTOR DEVICE

(75) Inventors: Min-San Huang, Hsinchu (TW); Rex Young, Hsinchu (TW); Su-Yuan Chang, Hsinchu Hsien (TW)

(73) Assignee: Powerchip Semiconductor Corp., Hsinchu (TW)

( * ) Notice: Subject to any disclaimer, the term of this patent is extended or adjusted under 35 U.S.C. 154(b) by 155 days.

(21) Appl. No.: 10/908,379

(22) Filed: May 10, 2005

(65) Prior Publication Data

US 2006/0115955 A1    Jun. 1, 2006

(30) Foreign Application Priority Data

Dec. 1, 2004    (TW) .............................. 93137010 A

(51) Int. Cl.
*H01L 21/336* (2006.01)
(52) U.S. Cl. ...................... 438/298; 438/424; 438/294; 257/E21.431
(58) Field of Classification Search ................ 438/294, 438/298, 424; 257/E21.431, E21.427
See application file for complete search history.

(56) References Cited

U.S. PATENT DOCUMENTS 5,705,840 A * 1/1998 Shen et al. .................. 257/344
6,649,481 B2 * 11/2003 Wu ............................. 438/301

* cited by examiner

*Primary Examiner*—Bradley K. Smith
(74) *Attorney, Agent, or Firm*—Jianq Chyun IP Office

(57) ABSTRACT

A method for manufacturing an anti-punch through semiconductor device is described. The method is applied to a substrate having a plurality of device isolation structures in parallel arrangements and the upper surface of the device isolation structures is protruded from the surface of the substrate. A plurality of conductive layers in parallel arrangement is formed on the substrate and crosses the device isolation structures. A plurality of trench devices is formed between device isolation structures under the conductive layers. Each trench device includes a first conductive doping region at the bottom of the trench. The method further includes forming spacers on the sidewalls of the device isolation structures and the conductive layers. A dopant implant process is then performed by using the spacers as a mask to form a second conductive doping region between adjacent first conductive doping regions.

9 Claims, 6 Drawing Sheets

METHOD FOR MANUFACTURING ANTI-PUNCH THROUGH SEMICONDUCTOR DEVICE

CROSS-REFERENCE TO RELATED APPLICATION

This application claims the priority benefit of Taiwan application serial no. 93137010, filed on Dec. 1, 2004. All disclosure of the Taiwan application is incorporated herein by reference.

BACKGROUND OF THE INVENTION

1. Field of the Invention

The present invention relates to semiconductor manufacturing process. More particularly, the present invention relates to a method for manufacturing an anti-punch through semiconductor device.

2. Description of Related Art

As the demand for higher integration of circuits increases, the design of a circuit device mandates a diminishment of the device dimension. When the dimension of a semiconductor device gradually reduces to a certain degree, the distance between devices correspondingly reduces. Hence, the various problems generated from fabricating a highly integrated device will become apparent. Accordingly, the industry is focused on developing a compact and a highly integrated semiconductor device with desirable qualities.

FIG. 1 is a cross-sectional diagram of a conventional semiconductor device. The semiconductor device includes a substrate 100, a dielectric layer 102, a trench device 104 and a doped region 106. The dielectric layer 102 is disposed above the substrate, while the trench device 104 is disposed in parts of the substrate 100 and the dielectric layer 102. The doped region 106 is configured in the substrate 100 under the trench device 104.

As the integration of a semiconductor device gradually increases, the conventional fabrication method of the semiconductor device confronts with many challenges. For example, as the integration of the semiconductor device increases, the distance between neighboring trench devices 104 correspondingly reduces. Therefore, a punch through (as depicted by arrow 108 in FIG. 1) between two neighboring doped regions easily occurs. Consequently, an abnormal electrical conduction between the neighboring trench devices 104 is developed, leading to poor operating speed and efficiency of the device. Further, a short or an open of the device is resulted, wherein the reliability and the yield of the entire process may be affected.

SUMMARY OF THE INVENTION

Accordingly, the present invention provides a method for fabricating an anti-punch through semiconductor device, wherein the problem of punch through between devices, which will lead to poor operating speed and efficiency of the device, can be resolved.

The present invention provides a method for fabricating an anti-punch through semiconductor device, wherein the method is applicable on a substrate having a plurality of device isolation structures formed therein in parallel arrangements to define a plurality of active regions. These device isolation structures are protruded from the surface of the substrate. Further, a plurality of conductive layers is parallel arranged on the substrate, wherein the conductive layers and the device isolation structures cross each other. A plurality of trench devices is formed underneath the conductive layers between every two device isolation structures. At least some of the trench device include a first conductive type doped region disposed at the bottom of the trench devices. The method also includes forming spacers on the sidewalls of the device isolation structures and the conductive layers, followed by using the spacers as a mask to perform an ion implantation process to form a second doped region between two neighboring first conductive type doped regions.

According to the embodiment of the present invention, forming the spacers includes forming an insulation material layer on the substrate and performing an anisotropic etching process to remove a portion of the insulation material layer thereafter. The material of the spacers includes, but not limited to, silicon nitride.

According to the embodiment of the present invention, the terrain of the second conductive type doped region is adjusted according to the thickness of the spacer.

According to the embodiment of the present invention, the first conductive doped region is a P type doped region and the second conductive doped region is an N type doped region.

According to the embodiment of the present invention, the first conductive doped region is an N type doped region and the second conductive doped region is a P type doped region.

According to the embodiment of the present invention, the above trench device is a trench memory device.

According to the embodiment of the present invention, the above trench device is a trench capacitor device.

According to the embodiment of the present invention, the above trench device is a trench transistor device.

In accordance to the present invention, using the spacers as a mask, a self-aligned ion implantation process is performed to form a region with an anti-punch through characteristic. Therefore, the problem of generating an electrical punch through can be prevented according to the present invention. Further, the size of the anti-punch through region can be accurately controlled by adjusting the thickness of the spacer. The process in forming the anti-punch through region can be integrated with the process in forming the complementary metal oxide semiconductor device to minimize the increase of cost.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
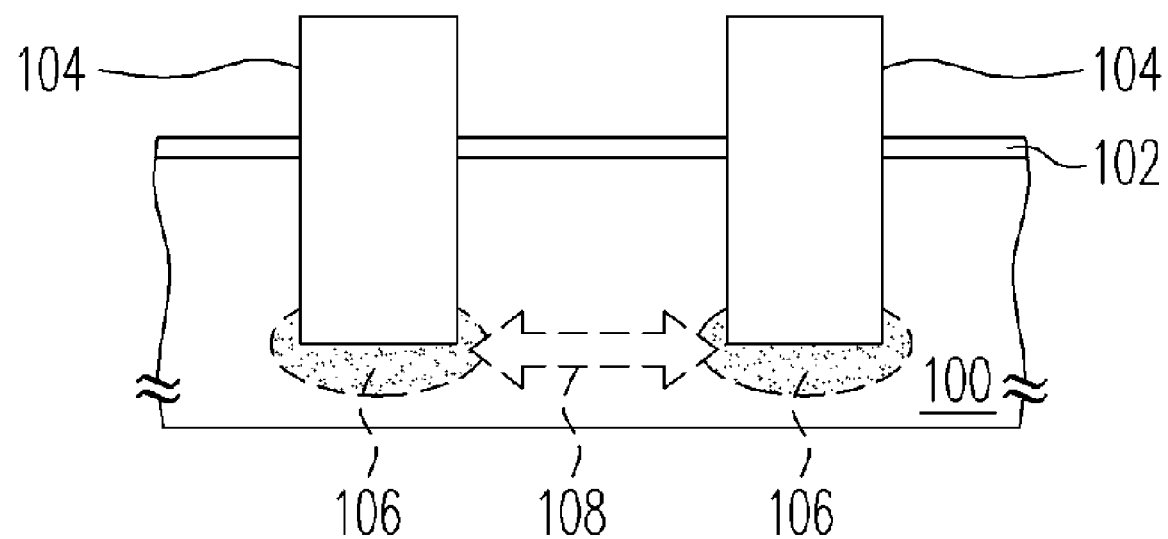
FIG. 1 is a cross-sectional diagram of a conventional semiconductor device.
Figure 2A:
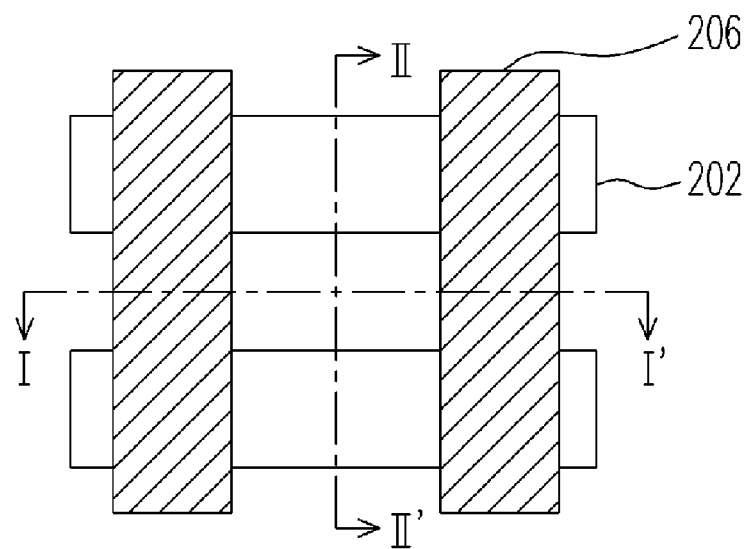
FIGS. 2A to 2C are top views showing the progression of steps for fabricating an anti-punch through semiconductor device according to one embodiment of the invention.
Figure 2B:
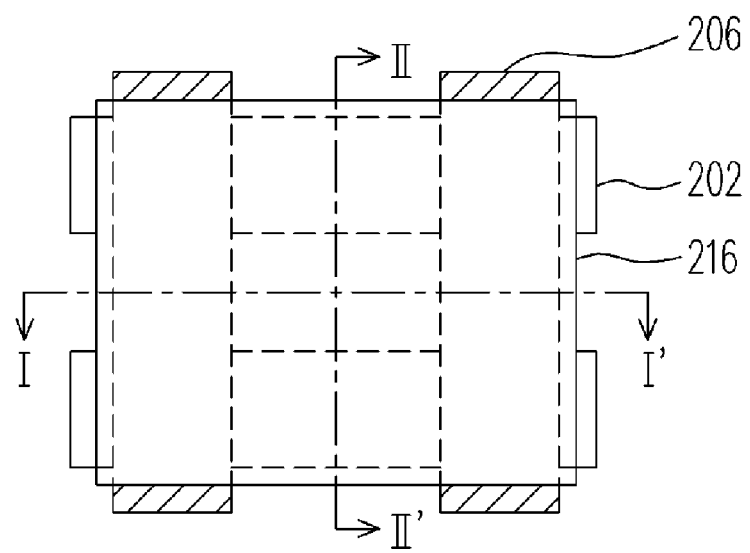
Figure 2C:
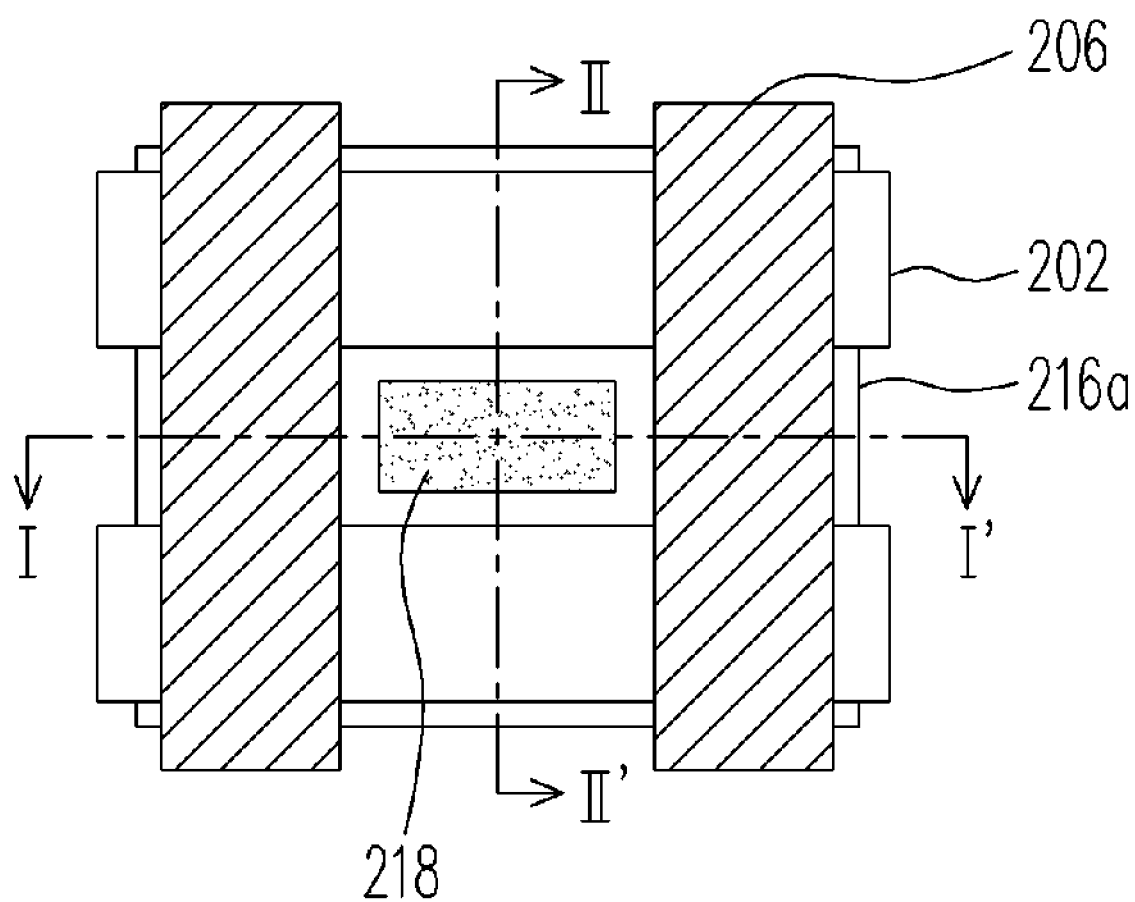
Figure 3A:
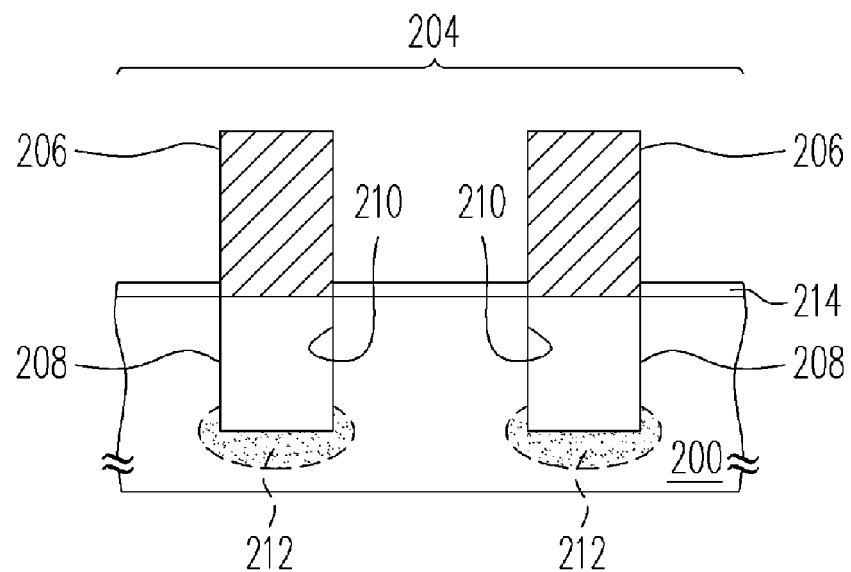
FIGS. 3A to 3C are cross-sectional views of FIGS. 2A to 2C, respectively, along the cutting lines I–I'.
Figure 3B:
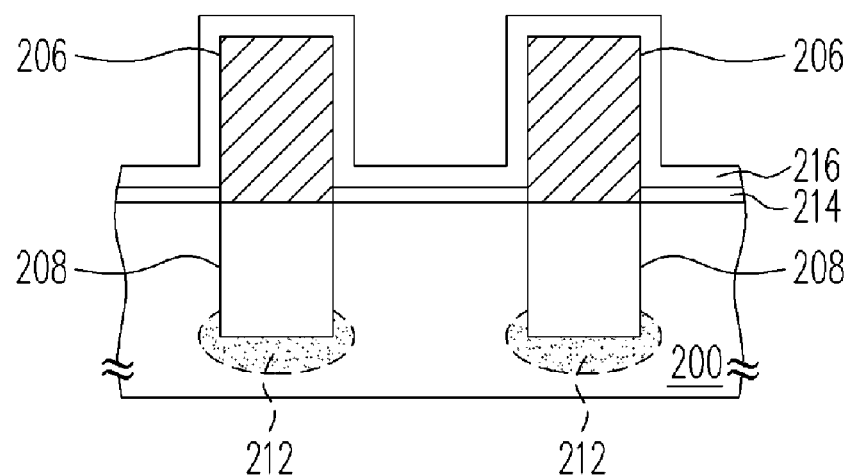
Figure 3C:
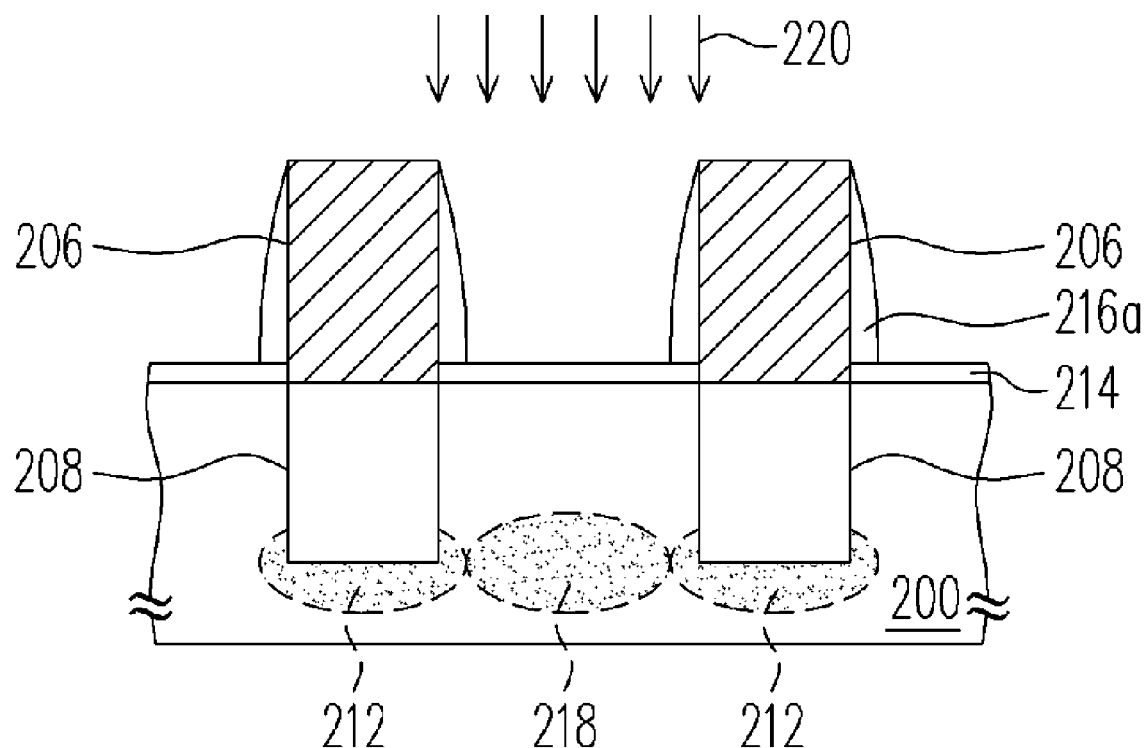
Figure 4A:
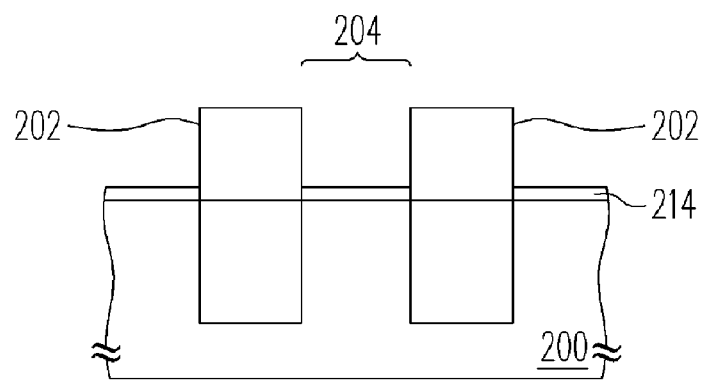
FIGS. 4A to 4C are cross-sectional views of FIGS. 2A to 2C, respectively, along the cutting lines II–II'.
Figure 4B:
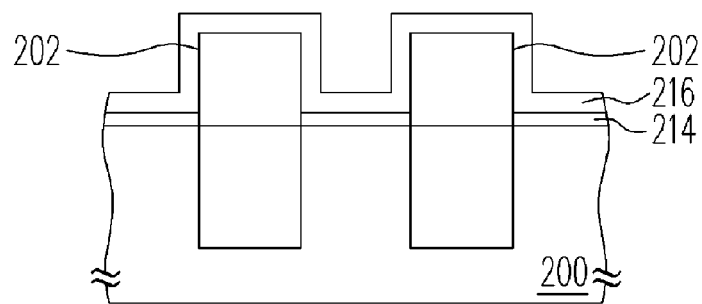
Figure 4C:
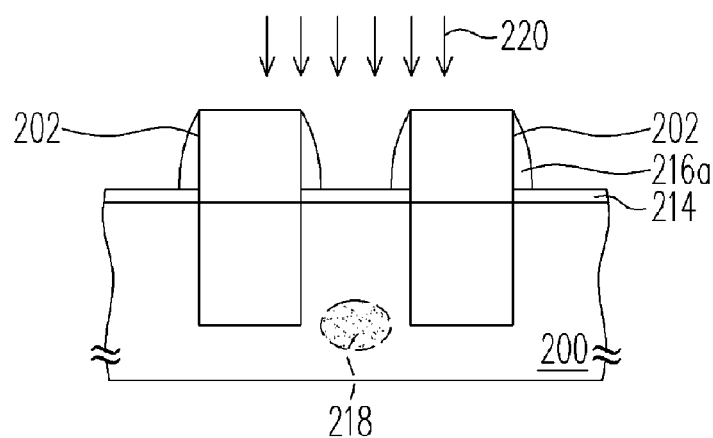

FIGS. 2A to 2C are top views showing the progression of steps for fabricating an anti-punch through semiconductor device according to one embodiment of the invention. FIGS. 3A to 3C are cross-sectional views of FIGS. 2A to 2C, respectively, along the cutting lines I–I'. FIGS. 4A to 4C are cross-sectional views of FIGS. 2A to 2C, respectively, along the cutting lines II–II'.

Referring concurrently to FIGS. 2A, 3A and 4A, a substrate 200 is provided. The substrate 200 is, for example, a silicon substrate. The substrate 200 includes a plurality of device isolation structures 202 disposed therein in parallel arrangements to define a plurality of active regions. These device isolation structures 202 are protruded from the surface of the substrate 200. The device isolation structures 202 are formed by the shallow trench isolation method, for example.

Furthermore, a plurality of parallel arranged conductive layers 206 is formed on the substrate 200, wherein the conductive layers 206 and the device isolation structures 202 cross each other. The conductive layers are formed with, for example, doped polysilicon. The conductive layers are formed by, for example, performing a chemical vapor deposition process to form an undoped polysilicon layer followed by an ion implantation process or doping in-situ during a chemical vapor deposition process. Additionally, under each conductive layer 206, a plurality of trench devices 208 is formed in the active region 204 between every two device isolation structures 202. The trench device 208 includes, but not limited to, the trench type capacitor, the trench type transistor or a trench type memory device.

In one embodiment, a dielectric layer 214 is formed on the substrate 200, wherein the material of the dielectric layer 214 includes silicon oxide, silicon oxide/silicon nitride/silicon oxide or other suitable materials. The dielectric layer 214 is formed by chemical vapor deposition, for example.

The trench device 208 includes an N-type doped region 212 disposed at the bottom of the trench 210. The N-type doped region 212 is formed by an ion implantation process, for example. As the integration increases, the punch through problem easily occurs between two neighboring N-type doped regions 212.

Referring concurrently to FIGS. 2B, 3B, and 4B, an insulation material layer 216 is formed on the substrate 200, wherein the insulation material layer 216 is, for example, a silicon oxide layer, formed by chemical vapor deposition, for example.

Continuing to FIGS. 2C, 3C and 4C, a portion of the insulation material layer 216 is removed to form spacers 216a on the sidewalls of the device isolation structures 202 and the conductive layers 206. Removing the portion of the insulation material layer 216 to form the spacers includes but not limited to performing an anisotropic etching process.

Thereafter, using the spacers 216a as a mask, a dopant implantation process 220 is performed to form a p-type doped region 218 between two neighboring N-type doped regions 212.

Since the P-type doped region 218 and the N-type doped region 212 are doped regions with different types of dopants, the p-type doped region 218 can serve as an anti-punch through region to prevent the electrical punch through problem. In other words, the p-type doped region 218 can prevent an electrical conduction between two neighboring N-type doped regions 212, which may affect the efficiency of a device.

Although the embodiments herein refers to the conductive doped region 212 of the trench device 208 and the anti-punch through region 218 being an N type doped region and a P-type doped region, respectively, it is to be understood that these embodiments presented by way of example and not by way of limitation. The conductive type dope region 212 of the trench device 208 and the anti-punch through region 218 can also be a P-type doped region and an N-type dope region, respectively. In other words, an N-type anti-punch through doped region is formed between neighboring P-type doped regions to improve the yield and the reliability of the manufacturing process.

In the invention, the boundary of the P-type doped region 218 (as shown in FIG. 2C) can be adjusted according to the thickness of the spacer 216a. In other words, the present invention can rely on the thickness of the spacer 216a to accurately define the position and the perimeter of a predetermined doped region.

In according to the above fabrication process, a doped region (P type doped region 218) with a dopant type different from that of the doped regions of the device (N type doped region 212) is formed between the doped regions of the device to prevent an electrical punch through between devices. The doped region (P type doped region 218) is formed by a self-aligned method, using the spacers 216a as a mask to define the anti-punch through region. Consequently, an abnormal electrical conduction between neighboring devices can be prevented to improve the yield and to raise the reliability of the manufacturing process.

Moreover, to prevent the anti-punch through doped region to form outside the central region (as shown in FIG. 2C) enclosed by the device isolation structures 202 and the conductive layers 206, a self-aligned ion implantation process is performed to obviate the problem of potentially affecting other doped regions (such as the N-type doped region 212).

It is worth to note that the fabrication process of the anti-punch through doped region of the present invention can be integrated with the fabrication process of the complementary metal oxide semiconductor device to minimize cost and efforts.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for fabricating an anti-punch through semiconductor device, applicable on a substrate, the method comprising:

forming a plurality of parallel arranged device isolation structures in the substrate for defining a plurality of active regions, wherein the device isolation structures are protruded from a surface of the substrate;

forming a plurality of parallel arranged conductive layers on the substrate, wherein the conductive layers cross the device isolation structures;

forming a plurality of trench devices in the active region between every two isolation structures underneath the conductive layers, wherein each trench device includes a first conductive type doped region disposed at a bottom of the trench device;

forming spacers on sidewalls of the device isolation structures and the conductive layer; and performing a dopant implantation process to form a second conductive type doped region between every two neighboring first conductive type doped regions using the spacers as a mask.

2. The method of claim 1, wherein the step of forming the spacers comprises:

forming an insulation material layer on the substrate; and performing an anisotropic etching process to remove a portion of the insulation material layer.

3. The method of claim 1, wherein the spacers are formed with a material comprising silicon nitride.

4. The method of claim 1, wherein a boundary of the second conductive type doped region is adjusted according to a thickness of the spacer.

5. The method of claim 1, wherein the first conductive type doped region is a P-type doped region and the second conductive type doped region is an N-type doped region.

6. The method of claim 1, wherein the first conductive type doped region is an N-type doped region and the second conductive type doped region is a P-type doped region.

7. The method of claim 1, wherein the trench device comprises a trench type memory device.

8. The method of claim 1, wherein the trench device comprises a trench type capacitor.

9. The method of claim 1, wherein the trench device comprises a trench type transistor.

* * * * *